(12) United States Patent
Chu et al.

(10) Patent No.: US 10,303,012 B2
(45) Date of Patent: May 28, 2019

(54) PIXEL STRUCTURE

(71) Applicant: AU Optronics Corporation, Hsin-Chu (TW)

(72) Inventors: Kung-Ching Chu, Hsin-Chu (TW); Yu-min Chi, Hsin-Chu (TW); Chen-Feng Fan, Hsin-Chu (TW); Sung-Yu Su, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 15/918,052

(22) Filed: Mar. 12, 2018

(65) Prior Publication Data

US 2018/0267370 A1    Sep. 20, 2018

(30) Foreign Application Priority Data

Mar. 14, 2017    (TW) .............................. 106108394 A

(51) Int. Cl.
| | |
|---|---|
| *G02F 1/1368* | (2006.01) |
| *G02F 1/1362* | (2006.01) |
| *G02F 1/1343* | (2006.01) |
| *H01L 27/12* | (2006.01) |

(52) U.S. Cl.
CPC ...... *G02F 1/134309* (2013.01); *G02F 1/1368* (2013.01); *G02F 1/13624* (2013.01); *G02F 1/134327* (2013.01); *G02F 1/136286* (2013.01); *H01L 27/124* (2013.01); *G02F 2001/134318* (2013.01); *G02F 2001/134345* (2013.01); *G02F 2001/134372* (2013.01); *G02F 2201/123* (2013.01)

(58) Field of Classification Search
CPC .............. H01L 27/124; H01L 27/3293; H01L 27/3241; H01L 27/3244; H01L 27/3237; H01L 27/3267; H01L 27/3286; G02F 1/134309; G02F 1/13624; G02F 1/1368; G02F 1/136286; G02F 1/134327; G02F 2001/134345; G02F 2001/134272
See application file for complete search history.

(56) References Cited

U.S. PATENT DOCUMENTS 8,325,308 B2    12/2012  Nishimura et al.
9,436,044 B2 *   9/2016  Qu ........................... G09G 3/36
(Continued)

*Primary Examiner* — Galina G Yushina
(74) *Attorney, Agent, or Firm* — WPAT, PC

(57) ABSTRACT

A pixel structure includes first and second gate lines, at least one data line, and a pixel unit. The pixel unit has first and second display areas and includes first and second active devices, a first pixel electrode layer, a common electrode layer, and a second pixel electrode layer. The first and second active devices are electrically connected to the first and second gate lines, respectively. The first pixel electrode layer is electrically connected to the first active device. The common electrode layer is disposed above the first pixel electrode layer and includes first and second portions which are located at the first and second display areas, respectively. The second pixel electrode layer is electrically connected to the second active device, and is located above the first portion of the common electrode layer but not above the second portion, where the second pixel electrode layer has a first slit pattern and the second portion of the common electrode layer has a second slit pattern.

14 Claims, 10 Drawing Sheets

(56) References Cited

U.S. PATENT DOCUMENTS

| | | | |
|---|---|---|---|
| 2007/0296883 A1* | 12/2007 | Kwon | G02F 1/136286 349/43 |
| 2012/0104392 A1* | 5/2012 | Son | G02F 1/134363 257/59 |
| 2013/0265514 A1* | 10/2013 | Li | G02F 1/1343 349/41 |
| 2014/0043215 A1* | 2/2014 | Hu | G02F 1/134309 345/29 |
| 2014/0362322 A1* | 12/2014 | Park | G02F 1/136286 349/46 |
| 2015/0060973 A1 | 3/2015 | Tsai et al. | |
| 2017/0285379 A1* | 10/2017 | Tsuruma | G02F 1/134309 |

* cited by examiner

PIXEL STRUCTURE

BACKGROUND

Technical Field

The present invention relates to a pixel structure.

Related Art

Conventional display technologies can only provide one display state in either a wide viewing angle or a narrow viewing angle. Display technologies of the wide viewing angle include, for example, the multi-domain vertical alignment (Multi-domain vertical alignment; MVA) liquid crystal display technology and the In-plane-Switching (In-plane-Switching; IPS) liquid crystal display technology. Display technologies of the narrow viewing angle include, for example, the Twisted Nematic (Twisted Nematic; TN) liquid crystal display technology. Any of the foregoing display technologies can only represent one display state in either the wide viewing angle or the narrow viewing angle, and cannot have two display modes of the wide viewing angle and the narrow viewing angle. However, in many electronic products, a user needs different display modes at different use sites and time. Therefore, a display capable of providing two display modes of the wide viewing angle and the narrow viewing angle is urgently required at present.

SUMMARY

In a plurality of embodiments of the present invention, in a pixel structure, electric field distributions of liquid crystals in a main display area and a secondary display area are designed to be different. By means of differences in optical brightness caused by rotations of liquid crystals above the secondary display area, optical brightness changes of the entire pixel structure are affected, so that a contrast ratio corresponding to a display panel is changed. Therefore, switching between wide viewing angle and narrow viewing angle modes are achieved.

According to some embodiments of the present invention, the pixel structure comprises a first gate line, a second gate line, at least one data line, and at least one pixel unit. The data line is intersecting with the first gate line and the second gate line. The first pixel unit has a first display area and a second display area and comprises a first active device, a second active device, a first pixel electrode layer, a common electrode layer, and a second pixel electrode layer. The first active device is electrically connected to the first gate line and the second active device is electrically connected to the second gate line. The first pixel electrode layer is electrically connected to the first active device. The common electrode layer is disposed above the first pixel electrode layer and comprises a first portion located at the first display area and a second portion located at the second display area, and the second portion has a second slit pattern. The second pixel electrode layer is electrically connected to the second active device and is located only above the first portion of the common electrode layer, wherein the second pixel electrode layer has a first slit pattern.

According to some embodiments of the present invention, the second pixel electrode layer has an overlapped portion overlapping with the first pixel electrode layer, and the overlapped portion is completely within a projection of the common electrode layer on the first pixel electrode layer.

According to some embodiments of the present invention, the first pixel electrode layer is disposed at both the first display area and the second display area.

According to some embodiments of the present invention, the first pixel electrode layer is disposed only at the second display area.

According to some embodiments of the present invention, the first portion of the common electrode layer is a pattern-less structure.

According to some embodiments of the present invention, the first portion of the common electrode layer has a third slit pattern, and the third slit pattern is positioned parallel to the first slit pattern on the second pixel electrode layer.

According to some embodiments of the present invention, the first display area is greater than the second display area and the first portion of the common electrode layer is greater than the second portion of the common electrode layer.

According to some embodiments of the present invention, the first display area is smaller than the second display area and the second pixel electrode layer is smaller than the first pixel electrode layer.

According to some embodiments of the present invention, the second slit pattern on the second portion of the common electrode layer is positioned un-parallel to the first slit pattern on the second pixel electrode layer.

According to some embodiments of the present invention, an included angle between the second slit pattern and the first slit pattern is approximately 5° to 80°.

According to some embodiments of the present invention, an first electrode width of the second portion of the common electrode layer having the second slit pattern is different from an second electrode width of the second pixel electrode layer having the first slit pattern.

According to some embodiments of the present invention, the pixel structure further comprises a third gate line and a second pixel unit, wherein the second pixel unit is adjacent to the first pixel unit, a first active device of the second pixel unit is electrically connected to the second gate line, and a second active device of the second pixel unit is electrically connected to the third gate line.

According to some embodiments of the present invention, the at least one data line comprises a first data line and a second data line, the first active device of the first pixel unit is electrically connected to the first data line, and the second active device of the first pixel unit is electrically connected to the second data line.

According to some embodiments of the present invention, the pixel structure further comprises a third data line and a second pixel unit, wherein the second pixel unit is adjacent to the first pixel unit, a first active device of the second pixel unit is electrically connected to the second data line, and a second active device of the second pixel unit is electrically connected to the third data line.

DETAILED DESCRIPTION

The following discloses a plurality of embodiments of the present invention with reference to the accompanying drawings. For a clear description, many practical details are described in the following description. However, it should be understood that these practical details are not intended to limit the present invention. That is, in some embodiments of the present invention, these practical details are not necessary. In addition, to simplify the drawings, some conventional structures and components are shown in the figures in a simple manner.

In this text, the phase "electrically connected" includes any direct and indirect electrical connection manners. For example, if the text describes that a first device is electrically connected to a second device, it represents that the first device may be directly connected to the second device, or be indirectly connected to the second device through other devices or connection manners. In addition, if transmission and providing about an electric signal are described, a person of ordinary skill in the art may understand that attenuation or other non-ideal changes may occur in the transmission process of the electric signal. However, a source and a receiving end for the transmission or providing of the electric signal should be substantially, if not specified in particular, considered as a same signal.

Figure 1A:
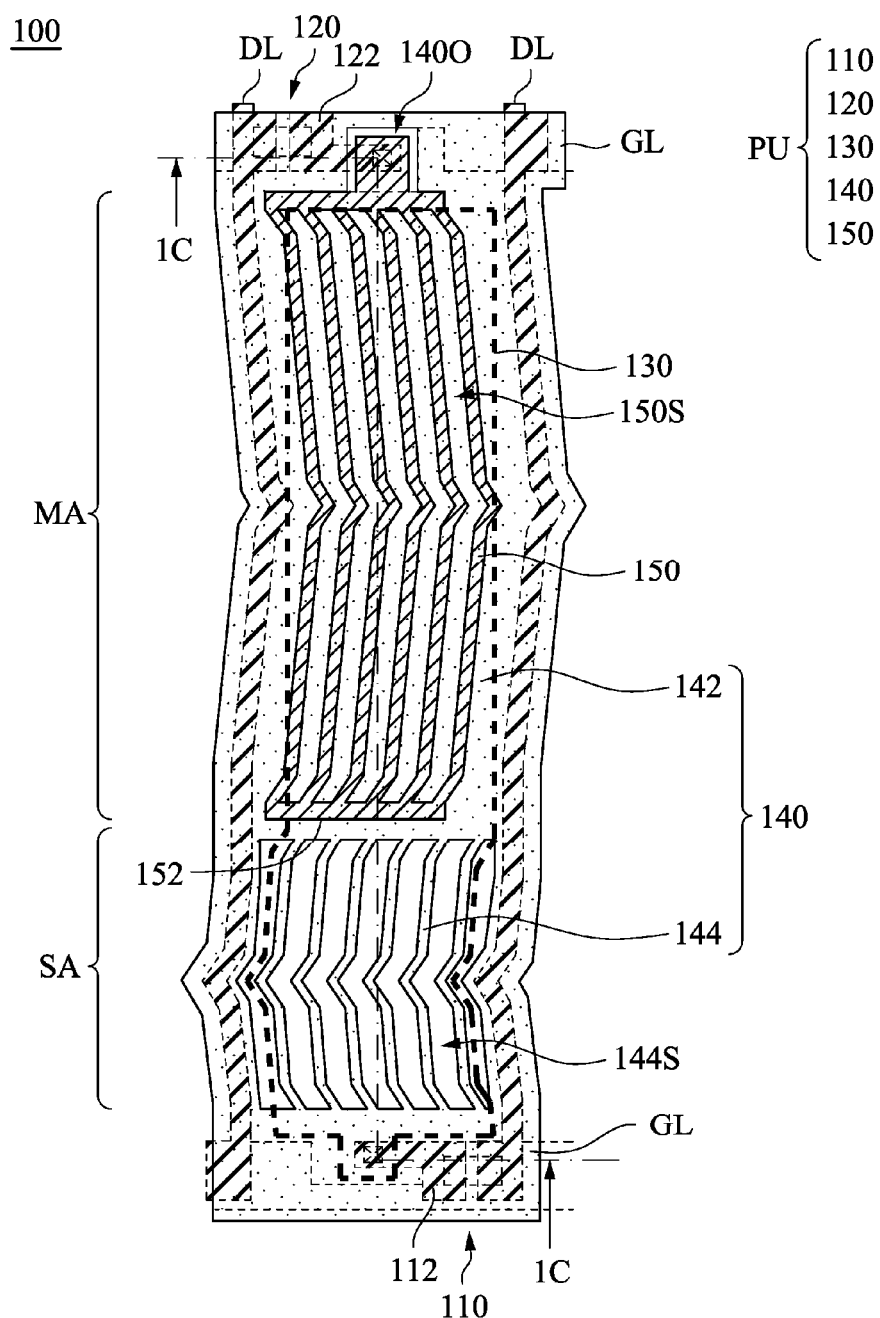
FIG. 1A is a schematic top view of a pixel structure according to a first embodiment of the present invention.
Figure 1B:
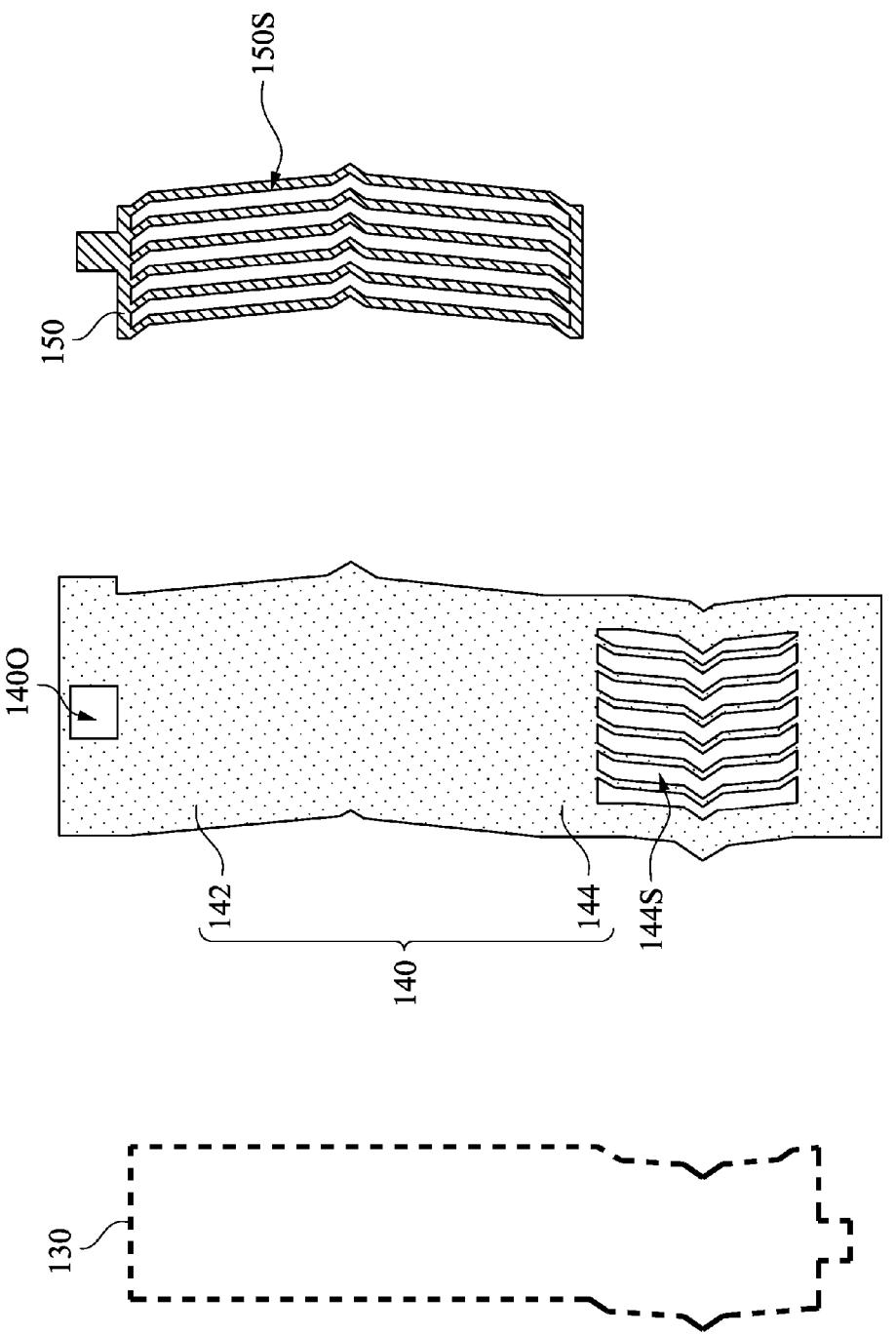
FIG. 1B is a schematic top view of some components of FIG. 1A.
Figure 1C:
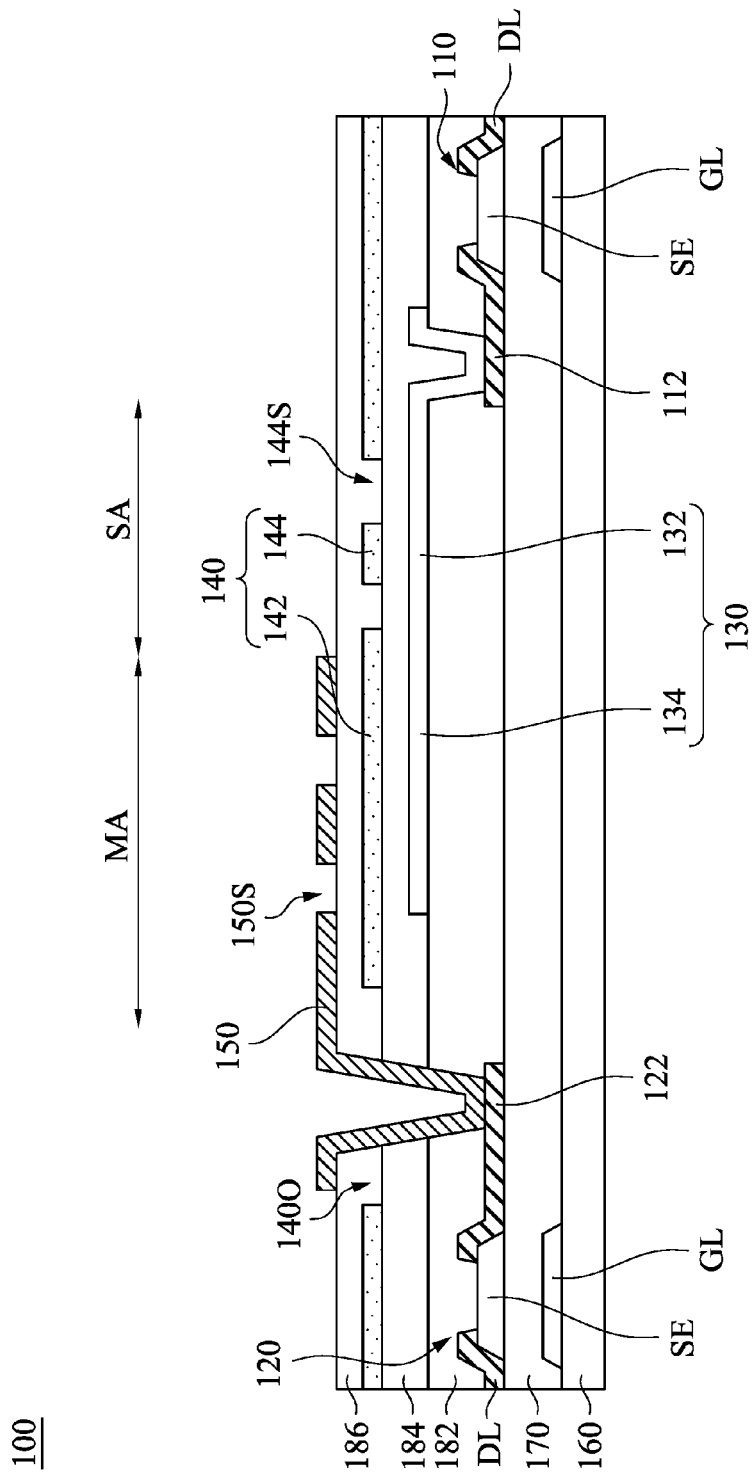
FIG. 1C is a schematic cross-section diagram along line 1C-1C in FIG. 1A.

FIG. 1A is a schematic top view of a pixel structure 100 according to a first embodiment of the present invention. FIG. 1B is a schematic top view of some components of FIG. 1A. FIG. 1C is a schematic cross-section diagram along line 1C-1C in FIG. 1A. Reference is made to FIG. 1A to FIG. 1C at the same time. The pixel structure 100 includes a main display area MA and a secondary display area SA. The pixel structure 100 includes at least one gate line GL, at least one data line DL, and at least one pixel unit PU. The data line DL is intersecting with the gate line GL. The pixel unit PU includes a first active device 110, a second active device 120, a first pixel electrode layer 130, a common electrode layer 140, and a second pixel electrode layer 150. The first active device 110 and the second active device 120 are electrically connected to the at least one gate line GL and the at least one data line DL.

The first pixel electrode layer 130 is electrically connected to a drain electrode 112 of the first active device 110 and is at least disposed at the secondary display area SA. The common electrode layer 140 is disposed above the first pixel electrode layer 130 and includes a first portion 142 and a second portion 144 which are located at the main display area MA and the secondary display area SA, respectively. The second pixel electrode layer 150 is electrically connected to a drain electrode 122 of the second active device 120 and is located above the first portion 142 of the common electrode layer 140 but not above the second portion 144 of the common electrode layer 140. That is, the second pixel electrode layer 150 is only located in the main display area MA, the secondary display area SA does not include the second pixel electrode layer 150, and the second pixel electrode layer 150 has a first slit pattern 150S. The second portion 144 of the common electrode layer 140 is located on the first pixel electrode layer 130 in the secondary display area SA and has a second slit pattern 144S. Herein, the main display area MA and the secondary display area SA are divided by an edge 152 of the second pixel electrode layer 150 which is close to the second portion 144.

In actual operations of the pixel structure 100, the common electrode layer 140 may be grounded or have other stable potentials. Potentials of the first pixel electrode layer 130 and the second pixel electrode layer 150 are respectively controlled by the first active device 110 and the second active device 120, and therefore may be different from a potential of the common electrode layer 140. Through the foregoing structure configuration, in the main display area MA, the second pixel electrode layer 150 having the first slit pattern 150S and the first portion 142 of the common electrode layer 140 may form a horizontal electric field, so as to control liquid crystals in a liquid crystal display to rotate. In the secondary display area SA, the second portion 144 of the common electrode layer 140 that has the second slit pattern 144S and the first pixel electrode layer 130 may form a horizontal electric field, so as to control the liquid crystals in the liquid crystal display to rotate.

In this way, in a wide viewing angle mode, a transmittance of a display panel corresponding to the secondary display area SA in the pixel structure 100 is set to be the lowest and a display panel corresponding to the main display area MA is used to display an image. At this time, the display panel has relatively good contrast ratios (dividing a bright-state light intensity by a dark-state light intensity) at both positions of a large viewing angle and a small viewing angle. In a narrow viewing angle mode, the display panel corresponding to the secondary display area SA in the pixel structure 100 is controlled to have proper brightness, so as to adjust dark-state brightness of the display panel, thereby lowering the contrast ratios of the display panel at positions of the large viewing angle and the small viewing angle. That is, differences in optical brightness caused by rotations of liquid crystals above the secondary display area SA affect optical brightness changes of the entire pixel structure, so that a contrast ratio corresponding to the display panel is changed. Therefore, switching between the wide viewing angle and the narrow viewing angle modes is achieved.

In the pixel structure 100, the first pixel electrode layer 130, the common electrode layer 140, and the second pixel electrode layer 150 are separated from each other. Specifically, with reference to FIG. 1C, the pixel structure 100 includes a substrate 160, a gate dielectric layer 170, a first insulation layer 182, a second insulation layer 184, and a third insulation layer 186. The gate line GL is disposed on the substrate 160 and the gate dielectric layer 170 covers the gate line GL. The data line DL and semiconductor layers SE and the drain electrodes 112 and 122 of the first active device 110 and the second active device 120 are disposed on the gate dielectric layer 170. The first insulation layer 182 covers the data line DL and the semiconductor layers SE and the drain electrodes 112 and 122 of the first active device 110 and the second active device 120. The first pixel electrode layer 130 is disposed on the first insulation layer 182 and the second insulation layer 184 covers the first pixel electrode layer 130. The common electrode layer 140 is disposed on the second insulation layer 184 and the third insulation layer 186 covers the common electrode layer 140. The second pixel electrode layer 150 is disposed on the third insulation layer 186. Herein, the first insulation layer 182, the second insulation layer 184, and the third insulation layer 186 are provided with a plurality of through holes, so that various electrode layers are electrically connected to the active devices, respectively. A common electrode layer 140 has an opening 1400 through which the second pixel electrode layer 150 is electrically connected to the second active device 120. In this way, the first pixel electrode layer 130, the common electrode layer 140, and the second pixel electrode layer 150 are electrically isolated from each other.

Structure configurations of various electrode layers according to some embodiments of the present invention are described below in detail.

In some embodiments of the present invention, the first pixel electrode layer 130 includes a pixel electrode 132 and a capacitor electrode 134 which is electrically connected to the pixel electrode 132, where the pixel electrode 132 is disposed in the secondary display area SA, and the capacitor electrode 134 extends from the pixel electrode 132 to the main display area MA. In some embodiments of the present invention, the pixel electrode 132 of the first pixel electrode layer 130 is a structure not having a pattern. That is, the pixel electrode 132 in a pixel unit PU is an integral structure not having a slit or an opening therein. In other embodiments, the pixel electrode 132 of the first pixel electrode layer 130 may have a slit pattern (not shown), where an extension direction of the slit pattern on the pixel electrode 132 is parallel to an extension direction of the second slit pattern 144S on the second portion 144 of the common electrode layer 140, and the slit pattern on the pixel electrode 132 is staggered from the second slit pattern 144S on the second portion 144 of the common electrode layer 140. In this way, at least some electric fields generated by the pixel electrode 132 may cooperate with the second portion 144 of the common electrode layer 140 to form a horizontal electric field.

In some embodiments of the present invention, the first portion 142 of the common electrode layer 140 is located on the capacitor electrode 134 of the first pixel electrode layer 130, and the second insulation layer 184 is sandwiched between the first portion 142 of the common electrode layer 140 and the capacitor electrode 134 of the first pixel electrode layer 130, so as to form a storage capacitor, where the storage capacitor may maintain a potential of the first pixel electrode layer 130. The capacitor electrode 134 of the first pixel electrode layer 130 may also optionally have a proper pattern.

The second pixel electrode layer 150 is located on the first portion 142 of the common electrode layer 140. The second pixel electrode layer 150 has an overlapped portion with the first pixel electrode layer 130 in a vertical projection direction of a substrate 160. The overlapped portion is completely within a projection of the common electrode layer 140. In this way, the common electrode layer 140 may shield electric field effect between the first pixel electrode layer 130 and the second pixel electrode layer 150, so as to avoid an electric-field distribution of the second pixel electrode layer 150 being affected by the first pixel electrode layer 130.

In this embodiment, the first portion 142 of the common electrode layer 140 is an entire structure not having a pattern. That is, the first portion 142 of the common electrode layer 140 does not have a slit or an opening therein, so as to achieve good shielding effects. However, the scope of the present invention should not be limited hereto. In other embodiments, patterns of the capacitor electrode 134 of the first pixel electrode layer 130 and the first portion 142 of the common electrode layer 140 are appropriately designed. For example, the patterns of the capacitor electrode 134 of the first pixel electrode layer 130 and the first portion 142 of the common electrode layer 140 are the same and are overlapped in the vertical projection direction of the substrate 160. The common electrode layer 140 may have a slit or an opening therein, and may also achieve the foregoing shielding effects.

In some embodiments of the present invention, an area of the main display area MA is greater than an area of the secondary display area SA. That is, an area of the first portion 142 of the common electrode layer 140 is greater than an area of the second portion 144 of the common electrode layer 140. In a plurality of embodiments of the present invention, the area refers to a total area including substantial parts and slit parts. In this way, when in the wide viewing angle mode, excessive lowering of an aperture ratio of a liquid crystal display may be avoided.

In some embodiments of the present invention, for example, material of the substrate 160 may be an organic material such as glass, quartz, ceramic, metal, alloy or polyimide (PI), polyethylene terephthalate (PET), polyethylene naphthalate (PEN), or polyamide (PA), may be another proper material, or may be a combination of at least two of the foregoing materials.

In some embodiments of the present invention, the foregoing first pixel electrode layer 130, common electrode layer 140, and second pixel electrode layer 150 may be made of transparent conductive materials, such as metal oxides (for example, an indium-tin oxide, an indium-zinc oxide, an aluminum-tin oxide, an aluminum-zinc oxide, an indium germanium zinc oxide, or other proper oxides or a stacked layer of at least two of the foregoing materials). In other embodiments, the first pixel electrode layer 130, the common electrode layer 140, and the second pixel electrode layer 150 may be made of reflective conductive materials, such as metal materials having a high reflectivity. The materials of the first pixel electrode layer 130, the common electrode layer 140, and the second pixel electrode layer 150 may be same or different.

Herein, for consistency in descriptions of the embodiments of FIG. 1A to FIG. 1C, the first pixel electrode layer 130 is not filled with any pattern therein. However, in other figures, in order to facilitate viewing, the first pixel electrode layer 130 is filled with an inclined line pattern. It should be understood that various different filled patterns in this application are only used for convenience of describing configurations and distributions of different components, and do not limit material characteristics of the components.

In some embodiments of the present invention, the gate dielectric layer 170, the first insulation layer 182, the second insulation layer 184, and the third insulation layer 186 may be made of proper insulating materials, such as inorganic materials (for example: silicon oxide, silicon nitride, silicon oxynitride, other proper material, or a combination of the foregoing materials) or organic materials (for example: photoresist, polyimide (PI), benzocyclobutene (BCB), epoxy, perfluorocyclobutane (PFCB), other proper materials, or a combination of the foregoing materials), or other proper material, or a combination of the foregoing materials. The materials of the gate dielectric layer 170, the first insulation layer 182, the second insulation layer 184, and the third insulation layer 186 may be same or different.

Figure 2:
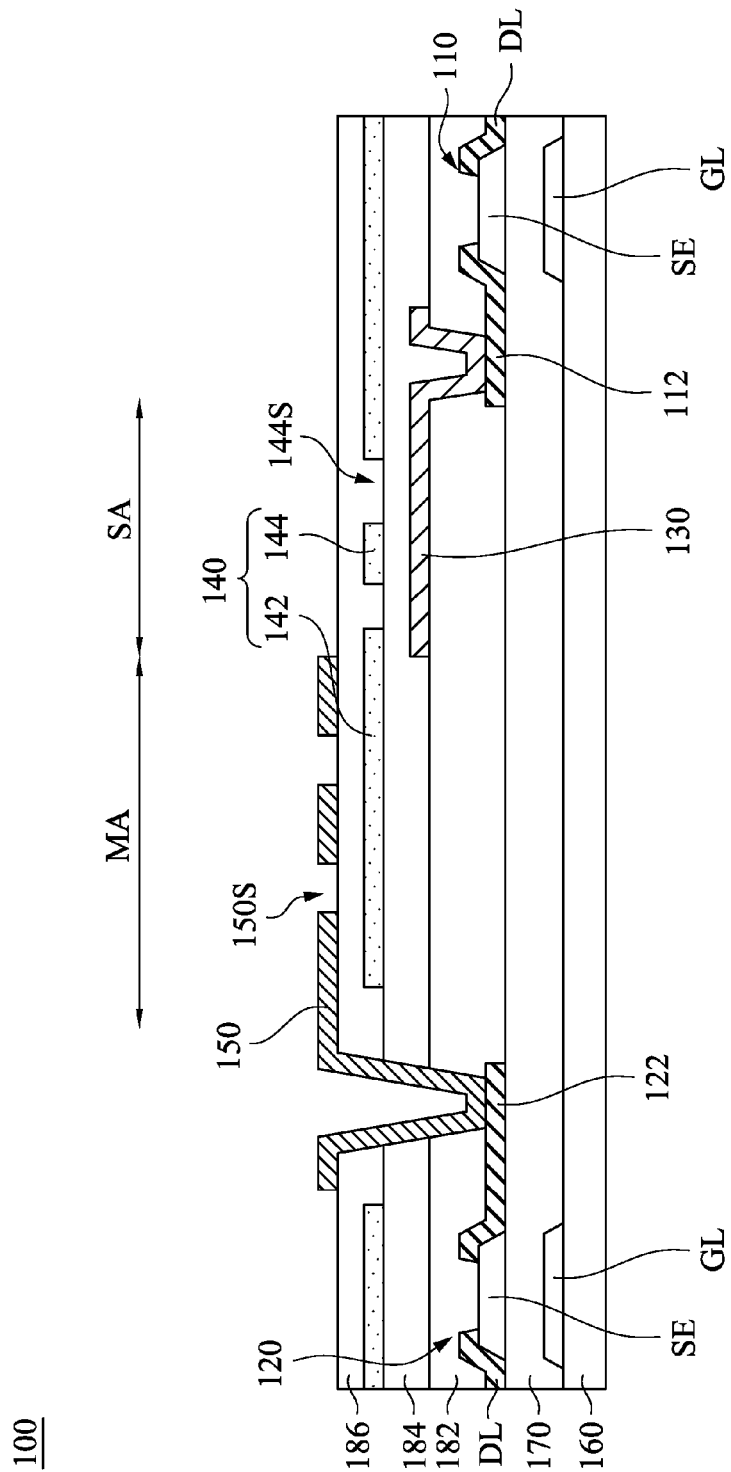
FIG. 2 is a schematic cross-section diagram of a pixel structure according to a second embodiment of the present invention.

FIG. 2 is a schematic cross-section diagram of a pixel structure 100 according to a second embodiment of the present invention. This embodiment is similar to the embodiment of FIG. 1C, and a difference is that: in this embodiment, the first pixel electrode layer 130 does not has the capacitor electrode 134, so that the first portion 142 of the common electrode layer 140 does not overlap with the first pixel electrode layer 130 in the vertical projection direction of the substrate 160. That is, the first pixel electrode layer 130 does not extend to the main display area MA, so as not to form a storage capacitor with the first portion 142 of the common electrode layer 140. Other details of this embodiment are substantially as stated above, and are not provided herein again.

Figure 3:
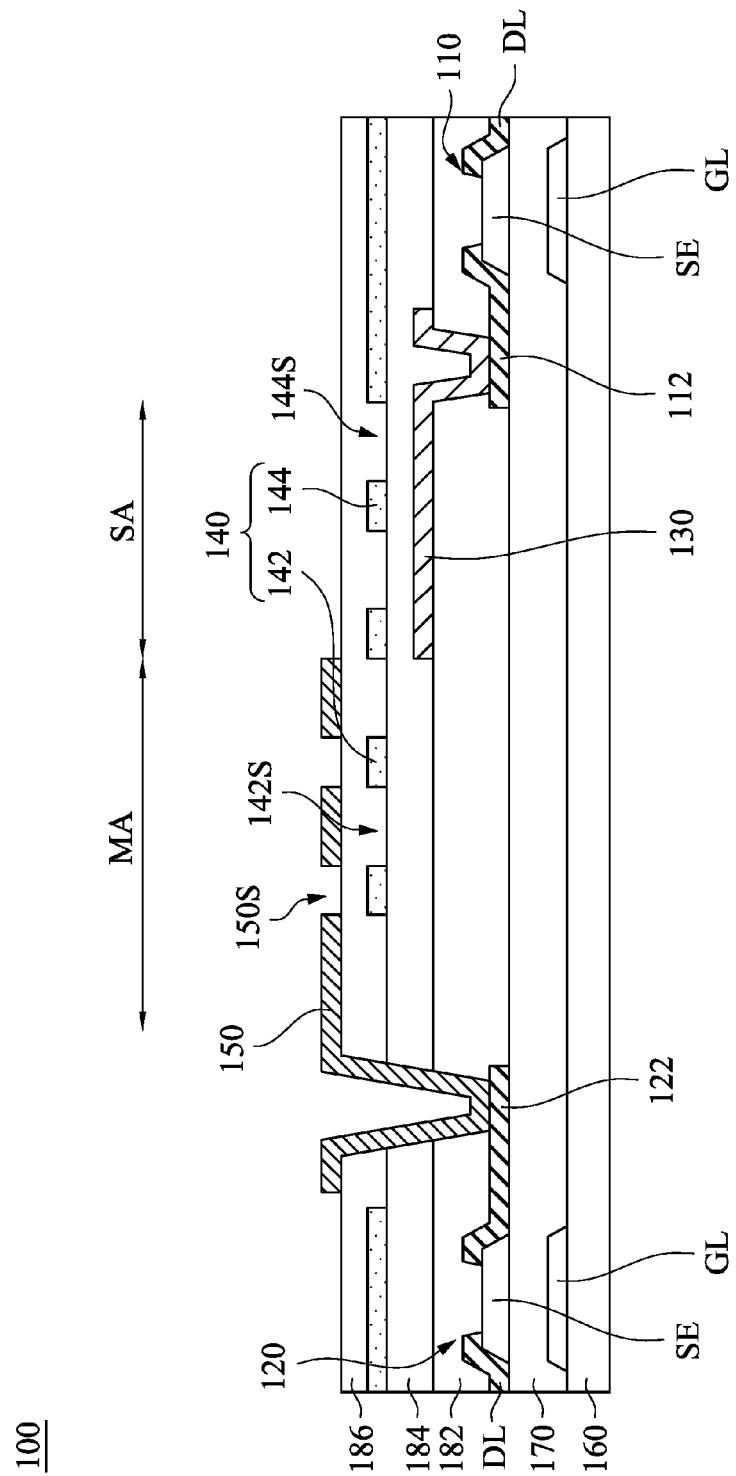
FIG. 3 is a schematic cross-section diagram of a pixel structure according to a third embodiment of the present invention.

FIG. 3 is a schematic cross-section diagram of a pixel structure according to a third embodiment of the present invention. This embodiment is similar to the embodiment of FIG. 2, and a difference is that: in this embodiment, the first portion 142 of the common electrode layer 140 has a third slit pattern 142S, where an extension direction of the third slit pattern 142S of the first portion 142 of the common electrode layer 140 is parallel to an extension direction of the first slit pattern 150S of the second pixel electrode layer 150. The first slit pattern 150S of the second pixel electrode layer 150 is staggered from the third slit pattern 142S of the first portion 142 of the common electrode layer 140. In this way, at least some electric fields generated by a strip-shaped electrode of the first portion 142 of the common electrode layer 140 may cooperate with the second pixel electrode layer 150 to form a horizontal electric field. Other details of this embodiment are substantially as stated above, and are not provided herein again.

Figure 4:
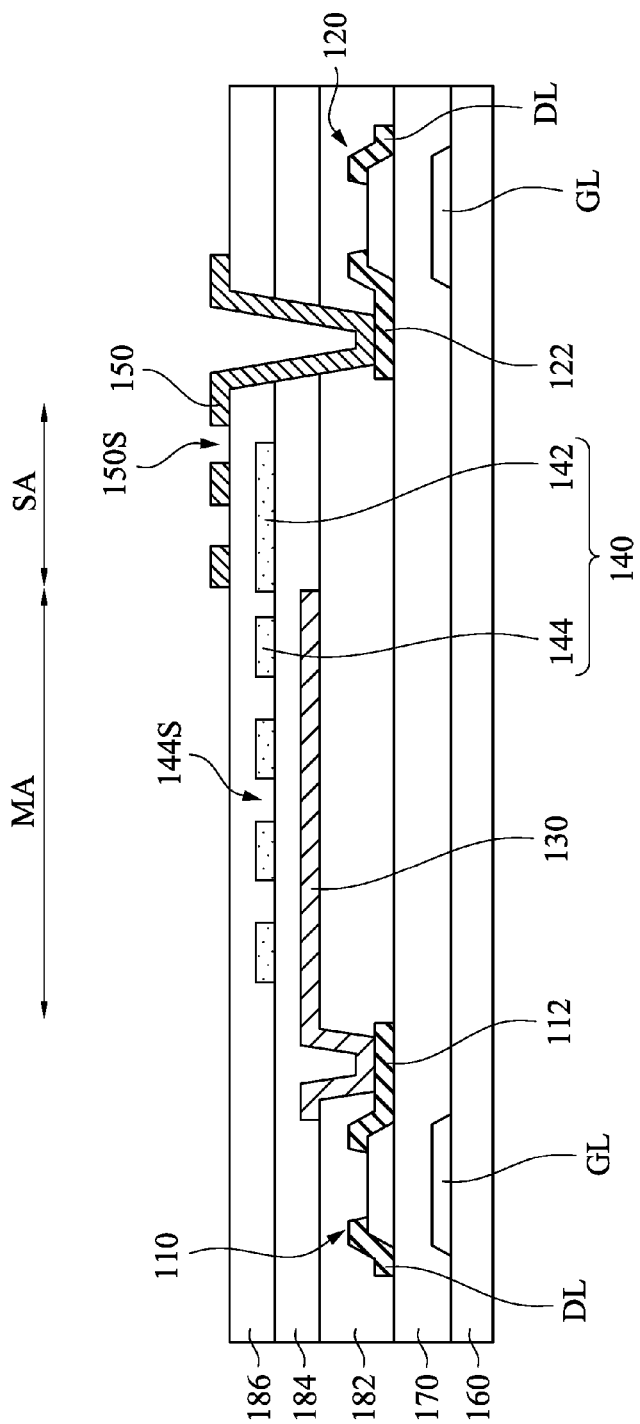
FIG. 4 is a schematic cross-section diagram of a pixel structure according to a fourth embodiment of the present invention.

FIG. 4 is a cross-sectional top view of a pixel structure according to a fourth embodiment of the present invention. This embodiment is similar to the embodiment of FIG. 3, and a difference is that: in this embodiment, the first pixel electrode layer 130 is disposed in the main display area MA, and the second pixel electrode layer 150 is disposed in the secondary display area SA but not in the main display area MA. On the basis that the area of the main display area MA is greater than the area of the secondary display area SA, an area of the second pixel electrode layer 150 is smaller than an area of the first pixel electrode layer 130. In this way, when in the wide viewing angle mode, excessive lowering of an aperture ratio of the liquid crystal display may be avoided. Other details of this embodiment are substantially as stated above, and are not provided herein again.

Figure 5:
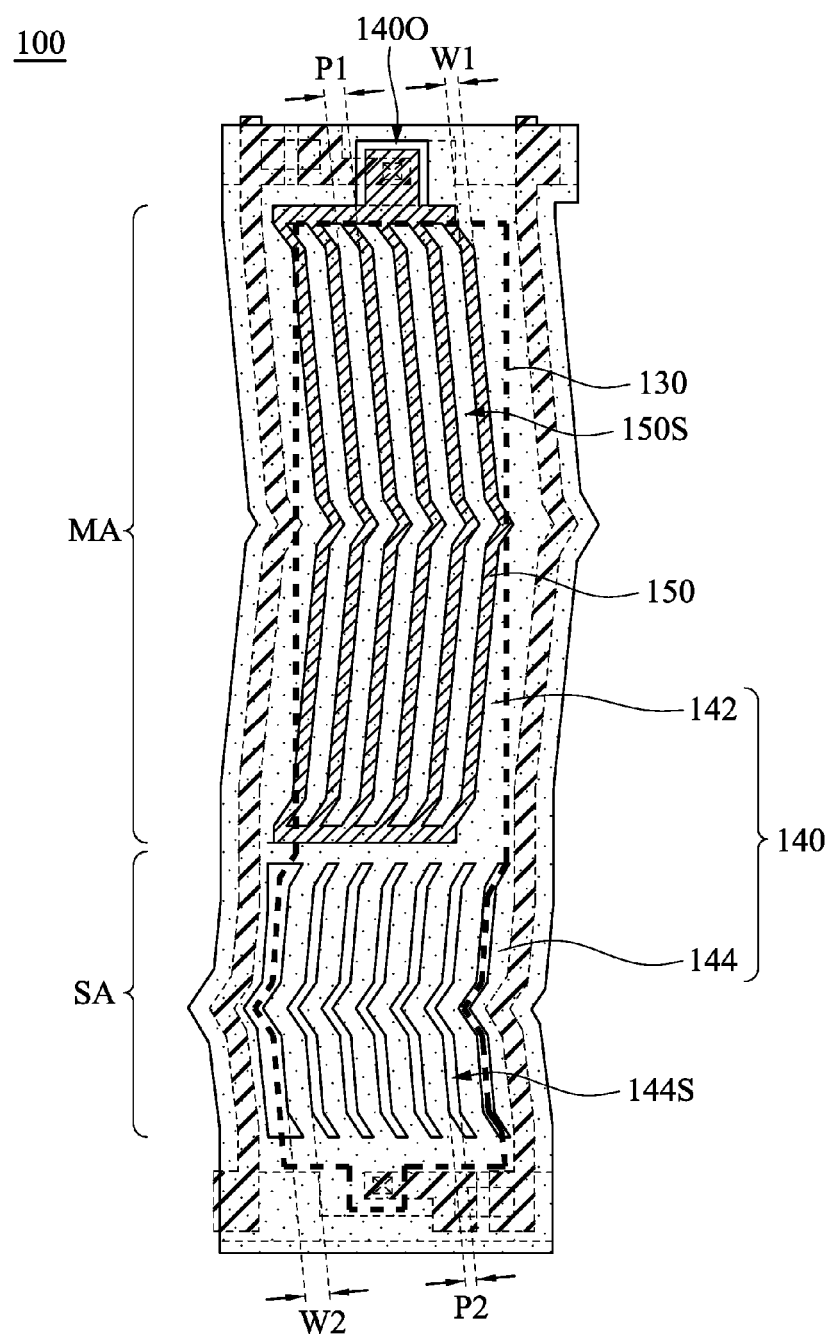
FIG. 5 is a schematic top view of a pixel structure according to a fifth embodiment of the present invention.

FIG. 5 is a schematic top view of a pixel structure according to a fifth embodiment of the present invention. This embodiment is similar to the embodiment of FIG. 1A, and a difference is that: in this embodiment, an electrode width W2 of the second portion 144 of the common electrode layer 140 having the second slit pattern 144S is different from an electrode width W1 of the second pixel electrode layer 150 having the first slit pattern 150S. Specifically, in this embodiment, the electrode width W2 of the second portion 144 of the common electrode layer 140 having the second slit pattern 144S is greater than the electrode width W1 of the second pixel electrode layer 150 having the first slit pattern 150S. Herein, relatively, a slit width P2 of the second slit pattern 144S is different from a slit width P1 of the first slit pattern 150S. Specifically, in this embodiment, the slit width P2 of the second slit pattern 144S is smaller than the slit width P1 of the first slit pattern 150S.

In this way, electric field distributions of liquid crystals in the main display area MA and the secondary display area SA are different. Because the differences in optical brightness caused by rotations of the liquid crystals above the secondary display area SA indirectly affect optical brightness changes of the main display area MA, differences in a contrast ratio corresponding to the main display area MA are increased, so that changes in a contrast ratio of the small viewing angle and changes in a contrast ratio of the large viewing angle are greater than original adjustable amplitudes. Hereto, switching between the wide viewing angle and the narrow viewing angle modes are achieved. Other details of this embodiment are substantially as stated above, and are not provided herein again.

Figure 6:
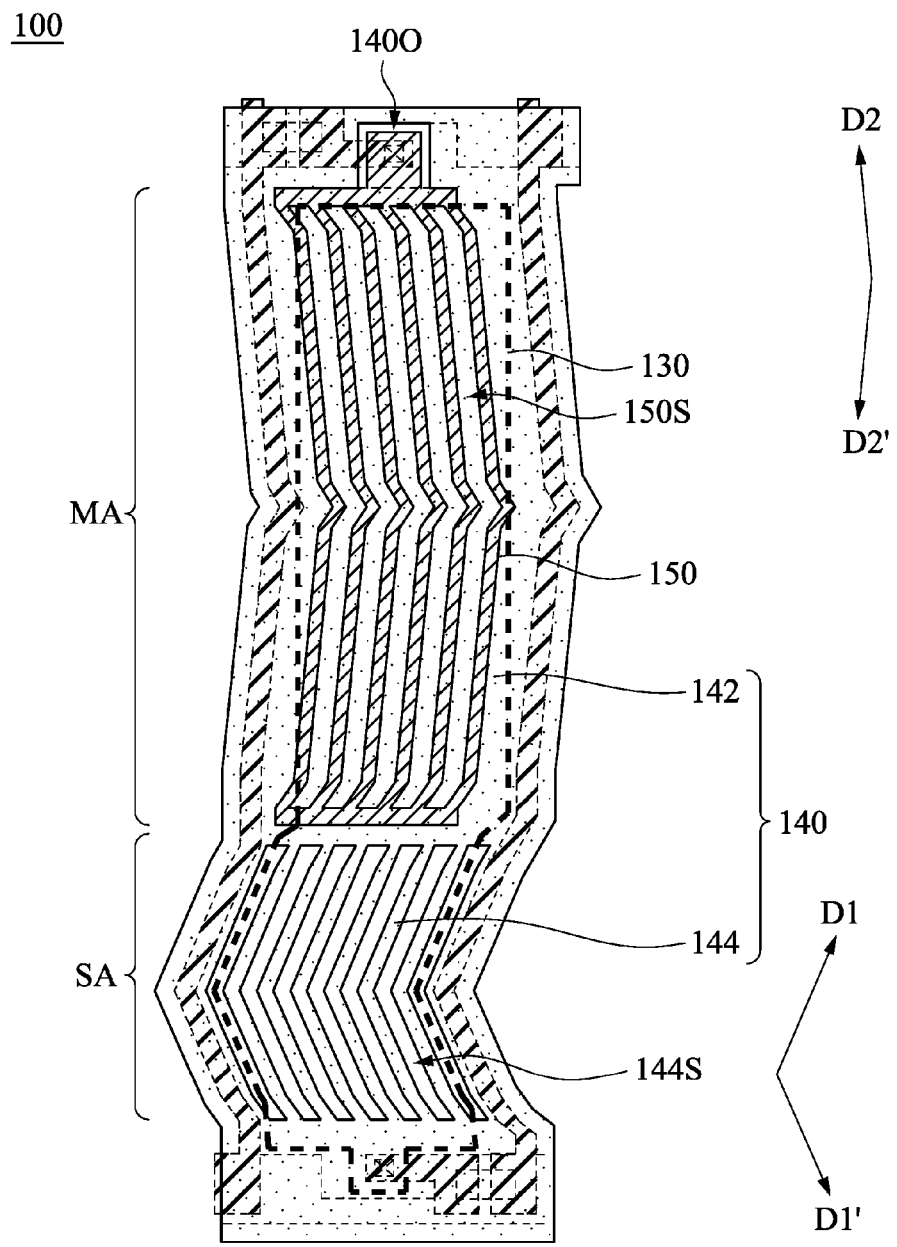
FIG. 6 is a schematic top view of a pixel structure according to a sixth embodiment of the present invention.

FIG. 6 is a schematic top view of a pixel structure 100 according to a sixth embodiment of the present invention. This embodiment is similar to the embodiment of FIG. 1A, and a difference is that: in this embodiment, extension directions D1 and D1' of the second slit pattern 144S of the second portion 144 of the common electrode layer 140 are not parallel to extension directions D2 and D2' of the first slit pattern 150S of the second pixel electrode layer 150.

In this way, falling directions of the liquid crystals of the main display area MA and the secondary display area SA are different. Because the differences in optical brightness caused by rotations of the liquid crystals above the secondary display area SA indirectly affect the optical brightness changes of the main display area MA, differences in the contrast ratio corresponding to the main display area MA are increased, so that changes in the contrast ratio of the small viewing angle and changes in the contrast ratio of the large viewing angle are greater than the original adjustable amplitudes.

For example, according to some embodiments of the present invention, an included angle between the extension direction D1 of the second slit pattern 144S of the second portion 144 of the common electrode layer 140 and the extension direction D2 of the first slit pattern 150S of the second pixel electrode layer 150 is approximately 5° to 80°. Other details of this embodiment are substantially as stated above, and are not provided herein again.

Figure 7:
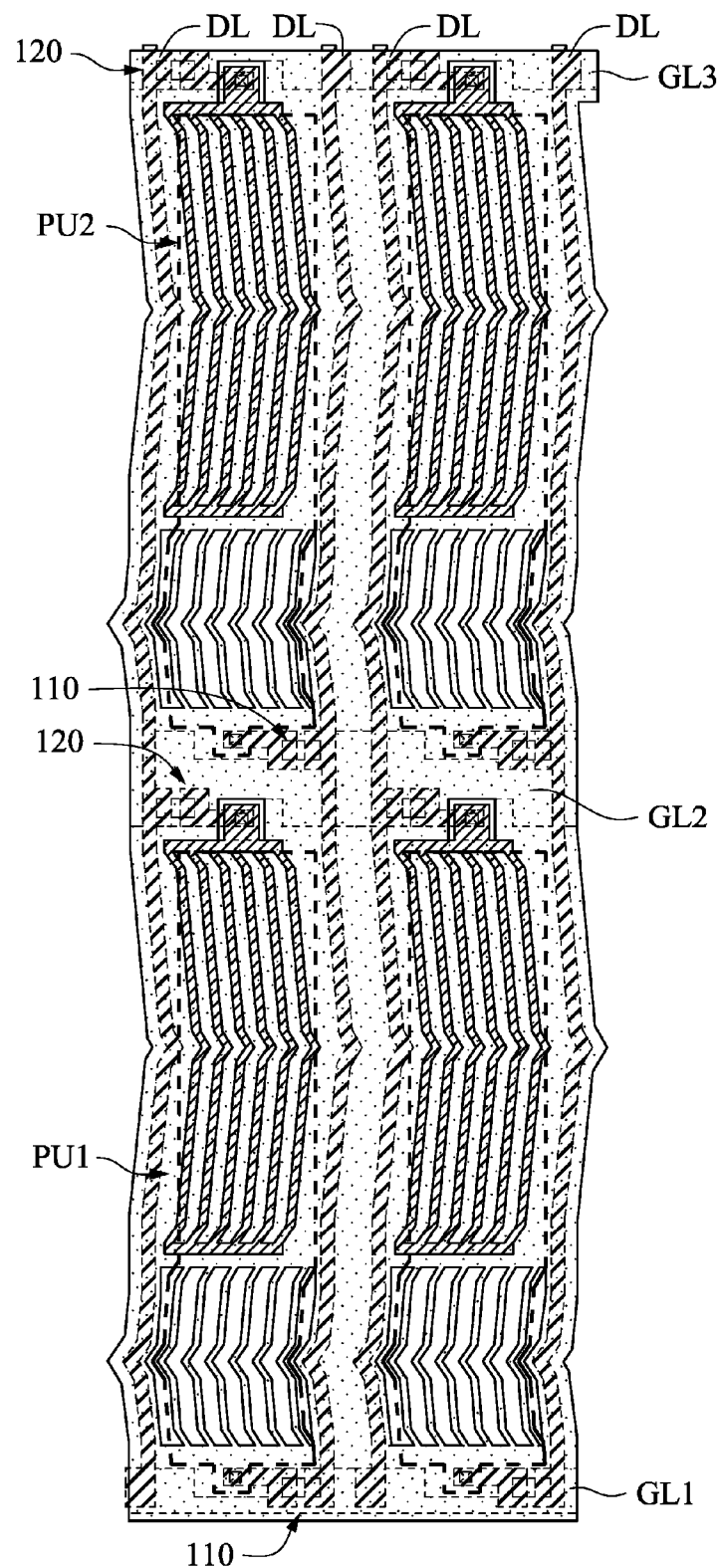
FIG. 7 is a schematic top view of a pixel structure according to some embodiments of the present invention.

FIG. 7 is a schematic top view of a pixel structure 100 according to some embodiments of the present invention. In some embodiments of the present invention, the pixel structure 100 includes a first gate line GL1, a second gate line GL2, a third gate line GL3, a first pixel unit PU1, and a second pixel unit PU2. The first pixel unit PU1 and the second pixel unit PU2 are adjacent to each other and are in a same column. A first active device 110 of the first pixel unit PU1 is electrically connected to the first gate line GL1, a second active device 120 of the first pixel unit PU1 is electrically connected to the second gate line GL2, the first active device 110 of the second pixel unit PU2 is electrically connected to the second gate line GL2, and the second active device 120 of the second pixel unit PU2 is electrically connected to the third gate line GL3.

That is, the second active device 120 of a secondary display area SA (with reference to FIG. 1A) controlled by each pixel unit in the same column actually shares a gate line with the first active device 110 of a main display area MA (with reference to FIG. 1A) controlled by another adjacent pixel unit. In addition, any two adjacent pixel units in pixel units in a same line may not share a data line, but this is not limited in this embodiment. Other details of this embodiment are substantially as stated above, and are not provided herein again.

Figure 8:
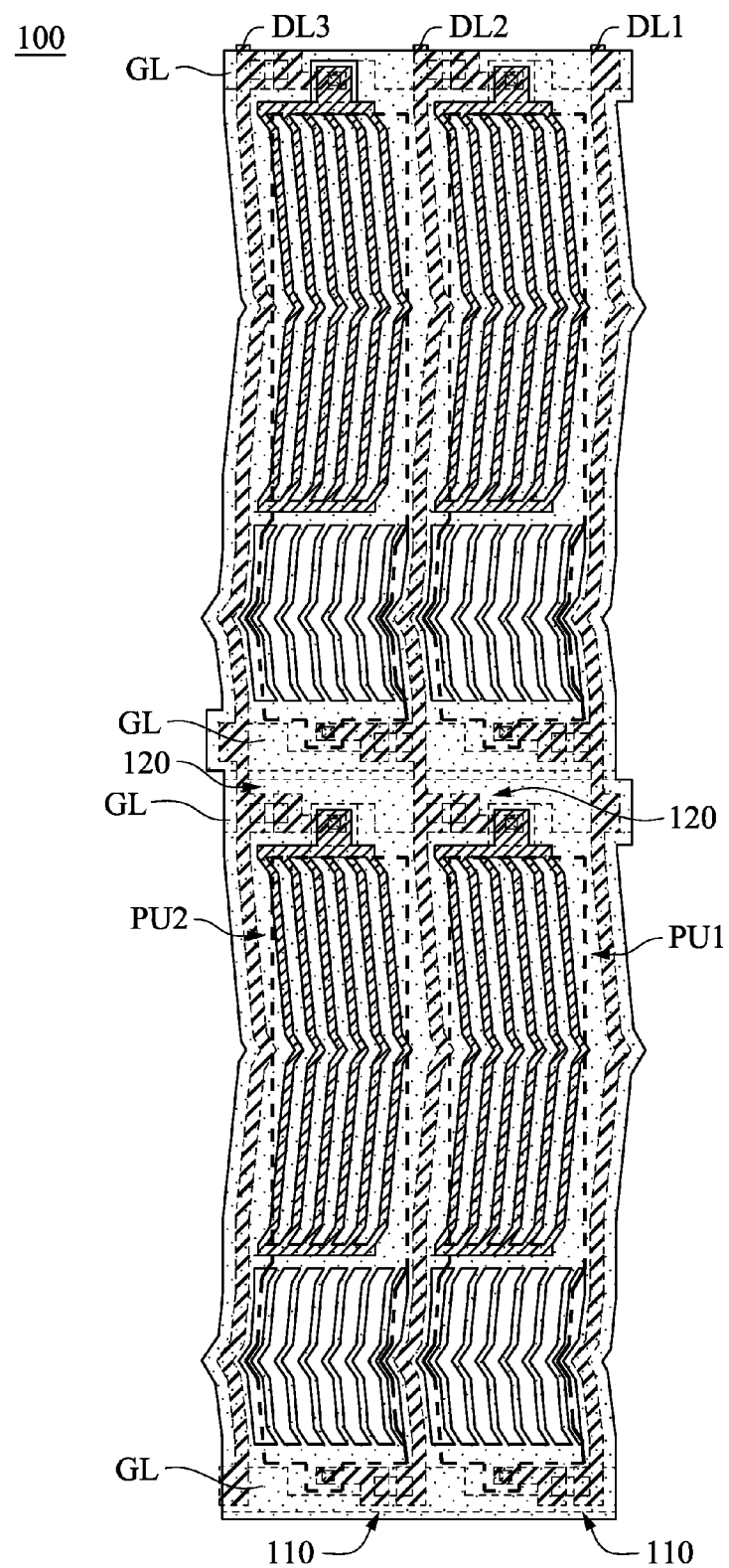
FIG. 8 is a schematic top view of a pixel structure according to some embodiments of the present invention.

FIG. 8 is a schematic top view of a pixel structure 100 according to some embodiments of the present invention. In some embodiments of the present invention, the pixel structure 100 includes a first data line DL1, a second data line DL2, a third data line DL3, a first pixel unit PU1, and a second pixel unit PU2. The first pixel unit PU1 and the second pixel unit PU2 are adjacent to each other and are in a same line. A first active device 110 of the first pixel unit PU1 is electrically connected to the first data line DL1, a second active device 120 of the first pixel unit PU1 is electrically connected to the second data line DL2, the first active device 110 of the second pixel unit PU2 is electrically connected to the second data line DL2, and the second active device 120 of the second pixel unit PU2 is electrically connected to the third data line DL3.

That is, the second active device 120 of a secondary display area SA (with reference to FIG. 1A) controlled by each pixel unit in the same line actually shares a data line with the first active device 110 of a main display area MA (with reference to FIG. 1A) controlled by another adjacent pixel unit. In addition, any two adjacent pixel units in pixel units in a same column may not share a gate line, but this is not limited in this embodiment. Other details of this embodiment are substantially as stated above, and are not provided herein again.

In a plurality of embodiments of the present invention, in a pixel structure, electric field distributions of liquid crystals in a main display area MA and a secondary display area SA are designed to be different. Because the differences in optical brightness caused by rotations of liquid crystals above a secondary display area SA indirectly affect optical brightness changes of a main display area MA, differences in a contrast ratio corresponding to the main display area MA are increased, so that changes in a contrast ratio of a small viewing angle and changes in a contrast ratio of a large viewing angle are greater than original adjustable amplitudes. Hereto, switching between wide viewing angle and narrow viewing angle modes are achieved.

Although the present invention discloses the foregoing by using a plurality of embodiments, the foregoing is not intended to limit the present invention. Any person of ordinary skill in the art may make various variations and modifications without departing from the scope and spirit of the present invention. Therefore, the protection scope of the present invention should be subject to the appended claims below.

What is claimed is:

1. A pixel structure, comprising:
 a first gate line and a second gate line;
 at least one data line intersected with the first gate line and the second gate line; and
 a first pixel unit having a first display area and a second display area, comprising:
  a first active device electrically connected to the first gate line;
  a second active device electrically connected to the second gate line;
  a first pixel electrode layer electrically connected to the first active device;
  a common electrode layer disposed above the first pixel electrode layer, comprising a first portion located at the first display area and a second portion located at the second display area, wherein the second portion has a second slit pattern; and
  a second pixel electrode layer electrically connected to the second active device, and located only above the first portion of the common electrode layer, wherein the second pixel electrode layer has a first slit pattern.

2. The pixel structure according to claim 1, wherein the second pixel electrode layer has an overlapped portion overlapping with the first pixel electrode layer, and the overlapped portion is completely within a projection of the common electrode layer on the first pixel electrode layer.

3. The pixel structure according to claim 1, wherein the first pixel electrode layer is disposed at both the first display area and the second display area.

4. The pixel structure according to claim 1, wherein the first pixel electrode layer is disposed only at the second display area.

5. The pixel structure according to claim 1, wherein the first portion of the common electrode layer is a pattern-less structure.

6. The pixel structure according to claim 1, wherein the first portion of the common electrode layer has a third slit pattern, and the third slit pattern is positioned parallel to the first slit pattern on the second pixel electrode layer.

7. The pixel structure according to claim 1, wherein the first display area is greater than the second display area, and the first portion of the common electrode layer is greater than the second portion of the common electrode layer.

8. The pixel structure according to claim 4, wherein the first display area is smaller than the second display area, and the second pixel electrode layer is smaller than the first pixel electrode layer.

9. The pixel structure according to claim 1, wherein the second slit pattern on the second portion of the common electrode layer is positioned un-parallel to the first slit pattern on the second pixel electrode layer.

10. The pixel structure according to claim 9, wherein an included angle between the second slit pattern and the first slit pattern is approximately 5° to 80°.

11. The pixel structure according to claim 1, wherein a first electrode width of the second portion of the common electrode layer having the second slit pattern is different from a second electrode width of the second pixel electrode layer having the first slit pattern.

12. The pixel structure according to claim 1, further comprising a third gate line and a second pixel unit, wherein the second pixel unit is adjacent to the first pixel unit, a first active device of the second pixel unit is electrically connected to the second gate line, and a second active device of the second pixel unit is electrically connected to the third gate line.

13. The pixel structure according to claim 1, wherein the at least one data line comprises a first data line and a second data line, the first active device of the first pixel unit is electrically connected to the first data line, and the second active device of the first pixel unit is electrically connected to the second data line.

14. The pixel structure according to claim 13, further comprising a third data line and a second pixel unit, wherein the second pixel unit is adjacent to the first pixel unit, a first active device of the second pixel unit is electrically connected to the second data line, and a second active device of the second pixel unit is electrically connected to the third data line.

* * * * *